(12) United States Patent
Sullivan et al.

(10) Patent No.: US 7,352,167 B2
(45) Date of Patent: Apr. 1, 2008

(54) DIGITAL TRIGGER

(75) Inventors: Steven K. Sullivan, Beaverton, OR (US); Kristie Veith, Portland, OR (US); Terrance R. Beale, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/388,925

(22) Filed: Mar. 24, 2006

(65) Prior Publication Data
US 2007/0222430 A1    Sep. 27, 2007

(51) Int. Cl.
*G01R 13/20*    (2006.01)
(52) U.S. Cl. .................. 324/121 R; 702/68; 345/418; 341/123; 356/5.06
(58) Field of Classification Search ............ 324/121 R, 324/76.15; 307/354, 360; 371/1
See application file for complete search history.

(56) References Cited

U.S. PATENT DOCUMENTS

| | | | | |
|---|---|---|---|---|
| 4,646,297 A | * | 2/1987 | Palmquist et al. .......... | 714/700 |
| 4,797,572 A | | 1/1989 | Metz | |
| 4,823,076 A | | 4/1989 | Haines et al. | |
| 4,888,588 A | * | 12/1989 | Castagnozzi ................ | 341/122 |
| 4,968,902 A | * | 11/1990 | Jackson ........................ | 327/74 |
| 5,097,147 A | * | 3/1992 | Stuebing et al. .............. | 327/74 |
| 5,124,597 A | * | 6/1992 | Stuebing et al. ............ | 327/261 |
| 5,446,650 A | | 8/1995 | Overhage et al. | |
| 5,471,159 A | * | 11/1995 | Stuebing et al. .............. | 327/24 |
| 5,946,293 A | * | 8/1999 | Beale et al. ................. | 370/210 |
| 6,915,218 B2 | * | 7/2005 | Pickerd ........................ | 702/57 |
| 7,072,804 B2 | * | 7/2006 | Weller ........................ | 702/190 |
| 2005/0225310 A1 | * | 10/2005 | Smith et al. ............ | 324/121 R |
| 2006/0074607 A1 | | 4/2006 | Weller | |

OTHER PUBLICATIONS

W.Van Driessche and C. Gullentops, "Digital Trigger Circuit with Excellent Noise Suppression", pp. 1659-1662, Rev. Sci. Instrum., vol. 46, No. 12, Dec. 1975, Copyright 1975 by the American Institute of Physics.

* cited by examiner

*Primary Examiner*—Minsun Oh Harvey
*Assistant Examiner*—Yuanda Zhang
(74) *Attorney, Agent, or Firm*—Francis I. Gray; Thomas F. Lenihan

(57) ABSTRACT

An improved digital trigger circuit has a plurality of data samples extracted from an input electrical signal for each sample clock cycle. The plurality of data samples are compared in parallel with a high threshold level and a low threshold level which provides hysteresis for noise rejection. Also the plurality of data samples are used to determine sub-sample trigger positioning. The comparison outputs are input to a digital trigger logic circuit for identifying a selected trigger event and generating a trigger for the acquisition of data from the input electrical signal for analysis and display. The digital trigger logic provides edge event triggering, pulse width triggering and transition time triggering, among others.

6 Claims, 6 Drawing Sheets

DIGITAL TRIGGER

BACKGROUND OF THE INVENTION

The present invention relates to the acquisition of data for analysis of an electrical signal, and more particularly to an improved digital trigger for capturing data samples from an input signal for analysis and display.

Traditionally test and measurement instruments that receive an electrical signal for analysis have used some type of triggering circuit to either start a display sweep in the case of analog instruments, or to initiate acquisition of a specified amount of digitized data samples from the electrical signal for analysis and display in the case of digital instruments. One specific example is a digital oscilloscope that constantly receives and digitizes the electrical signal, but only acquires the digitized data samples that exist surrounding a trigger event. The trigger event has traditionally been obtained from the electrical signal prior to digitization, i.e., from the analog electrical signal. The trigger criteria may be simple or very complex. In the digital instrument the electrical signal is digitized and stored in an acquisition memory in a recirculating fashion. When the trigger event occurs a predetermined number of samples of the electrical signal are stored in the acquisition memory after the trigger event and then acquisition stops. The contents of the acquisition memory before and after the trigger event are then analyzed and displayed.

U.S. Pat. No. 4,888,588 entitled "Digital Trigger" shows a digital trigger for a digitizing instrument having multiple analog-to-digital converters that are used in an interleaved fashion to provide multiple data samples each sample clock cycle separated in time by a specified percentage of the sample clock phase. The digital trigger includes a digital comparator for comparing the output signals from each analog-to-digital converter to a trigger threshold level, and the outputs from the comparators are then input to decoding logic which generates a digital trigger that indicates the clock phase in which the trigger point occurred. However such a trigger circuit does not provide the ability to differentiate between certain trigger events, i.e., using a single threshold level does not allow differentiation between rising edge triggers and "runt" triggers where the signal dips below the threshold and then re-crosses the threshold. Also the precision of trigger positioning is limited to the clock phase within which the trigger event occurred.

U.S. Pat. No. 5,446,650 entitled "Logic Signal Extraction" shows a technique for producing logic signal displays on a digital storage oscilloscope. An input digital logic signal is sampled to produce multi-bit digital samples. The multi-bit digital samples are processed using interpolative techniques to ascertain when the input logic signal crossed a hypothetical logic level threshold or pair of thresholds and when the logic signal was in one logic state or the other. The resulting transition times and logic states are then used as the basis for generating a variety of digital displays, including logic timing diagrams, state table displays and cursor readouts similar to those of a logic analyzer, but with enhanced resolution. However this technique is not used for generating trigger signals with precise location siting.

What is desired is an improved digital trigger that provides precision trigger positioning while having the ability to differentiate between different types of trigger events.

BRIEF SUMMARY OF THE INVENTION

Accordingly embodiments of the present invention provide an improved digital trigger capability The objects, advantages and other novel features of the present invention are apparent from the following detailed description when read in conjunction with the appended claims and attached drawing.

DETAILED DESCRIPTION OF THE INVENTION

Figure 1:
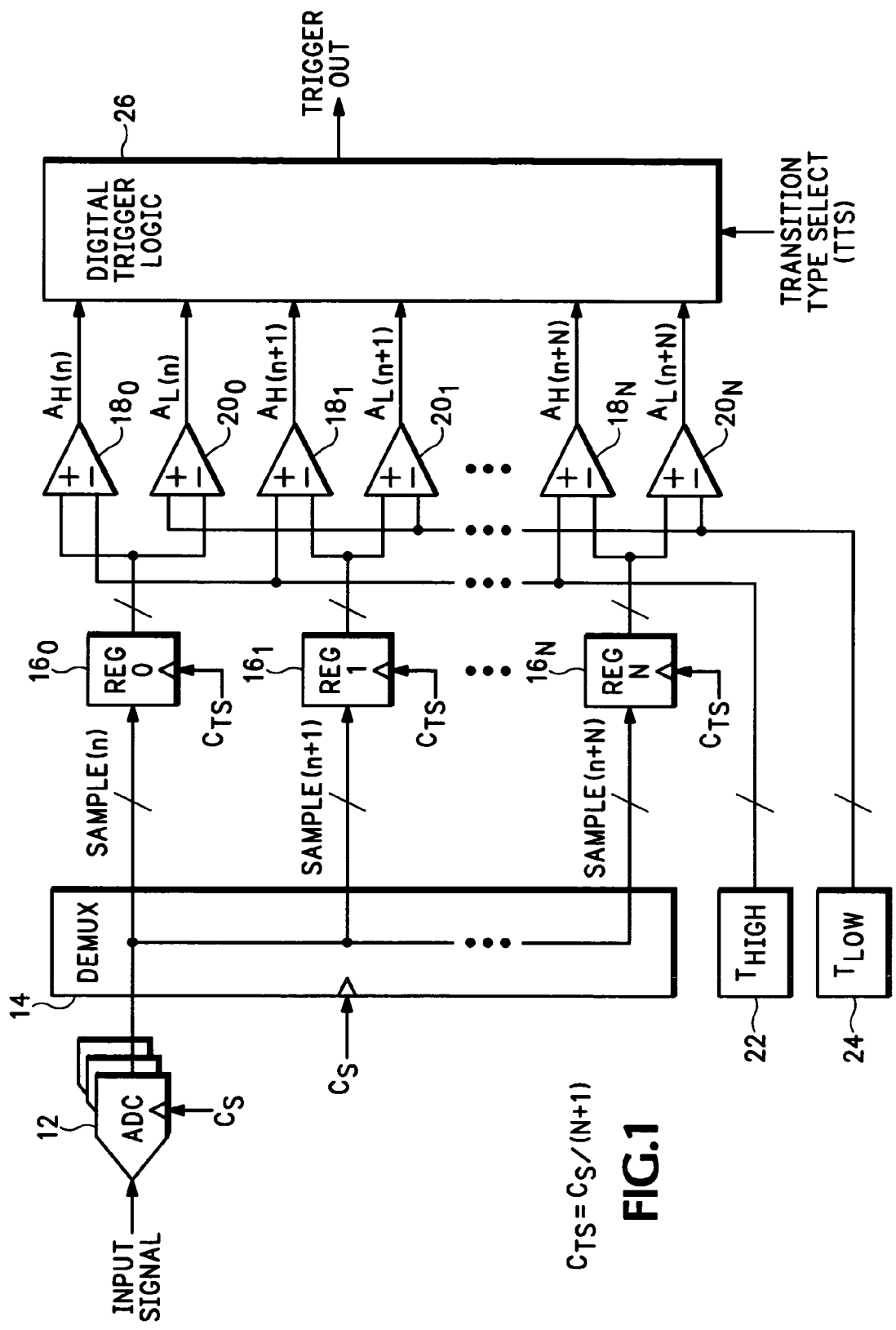
FIG. 1 is a block diagram view of an improved digital trigger according to the present invention.

Referring now to FIG. 1 an input signal is input to an analog-to-digital converter (ADC) 12 and digitized at a rate determined by a sample clock $C_S$. The resulting digital samples are routed by a demultiplexer 14 to a plurality of parallel registers 16 such that sample n is input to a first register $16_0$, sample n+1 is input to a second register $16_1$ and sample n+N is input to an Nth register $16_N$ in sequence. In the case of parallel ADCs 12 each individual ADC is coupled to an individual one of the registers 16. The registers 16 are read out in parallel by a trigger system clock $C_{TS}$ so that the next N+1 samples—samples n+N+1 through n+2N—are loaded into the registers to be read out on the next cycle of the trigger system clock. The trigger system clock is related to the sample clock by $C_{TS}=C_S/(N+1)$. The register outputs are input to respective high and low digital comparators 18, 20 for comparison with upper and lower threshold levels contained in respective high and low registers 22, 24. The resulting trigger signal outputs $A_{H(n)}$-$A_{H(n+N)}$ and $A_{L(n)}$-$A_{L(n+N)}$ are input in parallel to a digital trigger logic circuit 26 for processing to produce a trigger in response to an identified trigger event.

Although FIG. 1 shows the outputs of the ADC 12 being converted into a plurality of parallel data streams via the demultiplexer 14, the multiple data streams may also be produced as in the aforementioned U.S. Pat. No. 4,888,588 by clocking a plurality of ADCs on different phases of the sample clock $C_S$ so each data stream comes from its own individual ADC, in which case the sample clock and trigger clock may be the same clock. The significant point is that there are multiple samples of the input signal for each trigger clock cycle.

Figure 2:
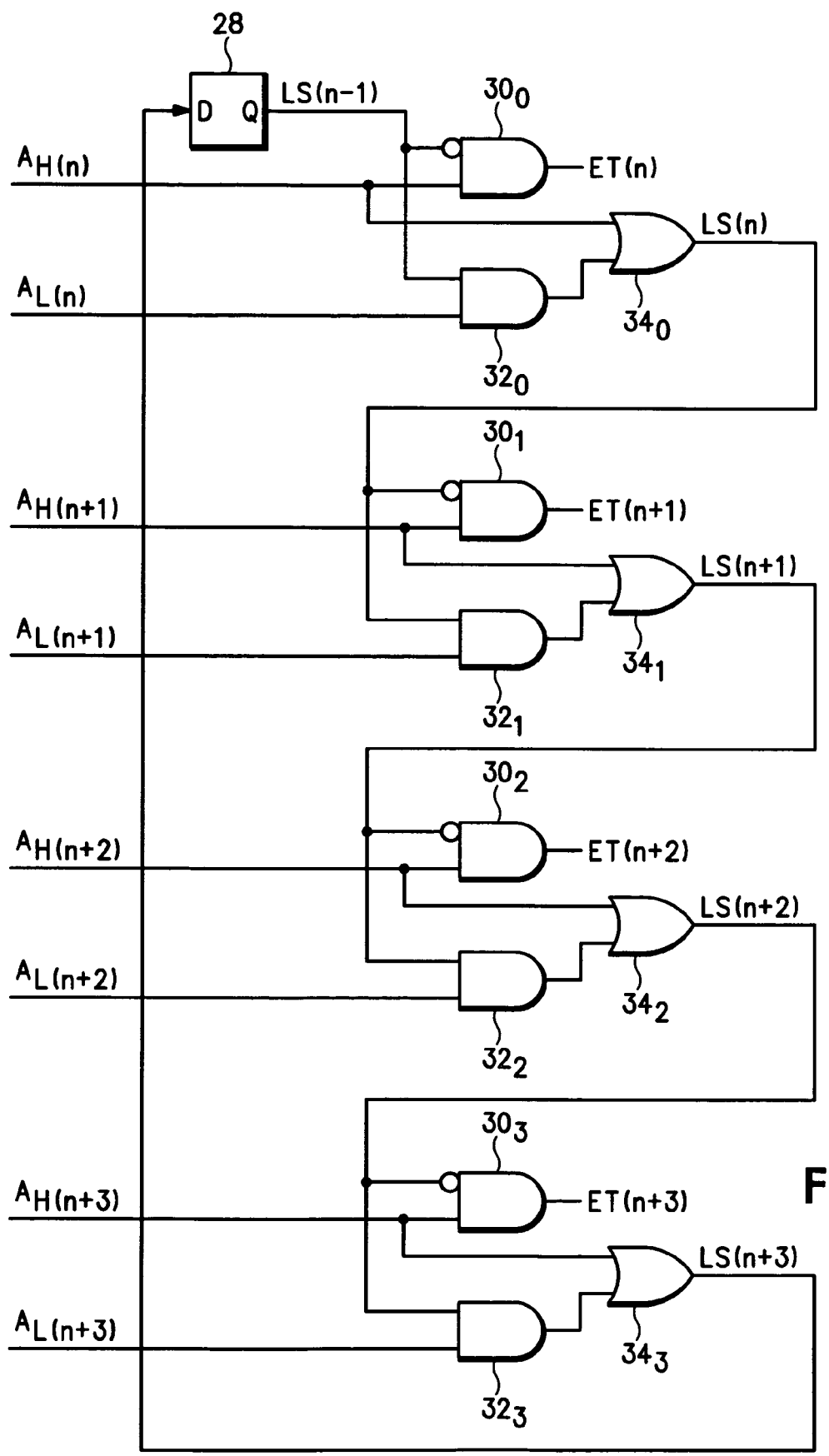
FIG. 2 is a block diagram view of an edge trigger logic for the improved digital trigger according to the present invention.

The digital trigger logic circuit 26 contains a plurality of circuits for processing the comparator outputs according to a desired type of trigger event. A circuit for determining an edge trigger event is shown in FIG. 2. A rising edge trigger event is recognized when the input signal first passes above the lower trigger threshold and then continues past the upper trigger threshold. Using upper and lower trigger thresholds allows hysteresis to be added to the edge trigger event detection. Hysteresis keeps a rising edge trigger event from being recognized when the signal starts above the upper trigger threshold, drops below the upper trigger threshold and then returns above the upper trigger threshold. Such an event is called a "runt" and is detected by runt trigger logic. Without hysteresis when a single trigger level is used, a rising edge trigger event is detected when one sample is below the trigger level and the next sample is above the trigger level. With hysteresis it is not possible to find the rising edge trigger event by just looking at two adjacent comparators. When one comparator detects a low and the next detects a high, there may or may not be the proper conditions for the rising edge trigger event. It is necessary to trace backward in time and discover if the trigger signal was rising from a low level, in which case a rising edge trigger event should be generated, or if the trigger signal was falling from a high level and then went high again, in which case a rising edge trigger event should not be generated.

Rather than tracing back in time the edge trigger circuit of FIG. 2 keeps track of the logic state of the trigger signal. The logic state (LS) is high when the trigger signal is above the upper trigger threshold and is low when the trigger signal is below the lower trigger threshold. When the trigger signal is between the two trigger thresholds, the logic state remains unchanged. A rising edge trigger condition is recognized by using the logic state signal and the output of the upper level comparator $A_H$. A rising edge trigger event is indicated when the upper level comparator is true and the logic state is low. The illustration of FIG. 2 is limited to four parallel paths for simplicity only.

The signals labeled LS are the logic state signals. The signals labeled ET are high when the conditions for a rising edge trigger event are met. The logic state signal from the last sample of the parallel trigger signal LS(n+3) is loaded into a register 28 and used as input to the first sample of parallel data on the next trigger system clock. For each path there is a NAND gate 30, an AND gate 32 and an OR gate 34. The ET output from the NAND gate 30 goes high when the LS of the previous sample is low and the upper comparator output $A_H$ is high. The LS from the OR gate 34 is high when the output from the upper level comparator is high or the prior LS and the output $A_L$ from the lower level comparator is high. Although this circuit is logically correct, it is not very fast as the LS signal has to propagate through eight gates on every trigger system clock. In addition increasing the number of parallel paths does not improve the speed of the circuit. The increased number of parallel paths may increase the time for the LS signal to propagate, but there are more gates for the signal to propagate through. Also adding pipeline stages does not make the circuit faster. The LS signal has to propagate through all parallel comparator circuits in one trigger system clock.

A technique for examining the output of a few stages in parallel and quickly computing the logic state of the last stage is well known, as it is used to propagate the "carry" in binary adders. This fast propagation logic allows the logic state signal to be computed in less time. In order to reduce the number of characters in each term of the following equations, LS(n) is represented with LS0, LS(n+1) with LS1, etc. The equation for LS0 is:

$$LS0 = AH0 | (AL0 \ \& \ LS(n-1))$$

Using look-ahead logic the right hand side of the above equation may be used instead of LS0 when computing LS1, which results in the following equations:

$$LS1 = AH1 | (AL1 \ \& \ AH0) | (AL1 \ \& \ AL0 \ \& \ LS(n-1))$$

$$LS2 = AH2 | (AL2 \ \& \ AH1) | (AL2 \ \& \ AL1 \ \& \ AH0) | (AL2 \ \& \ AL1 \ \& \ AL0 \ (LS(n-1))$$

Figure 3:
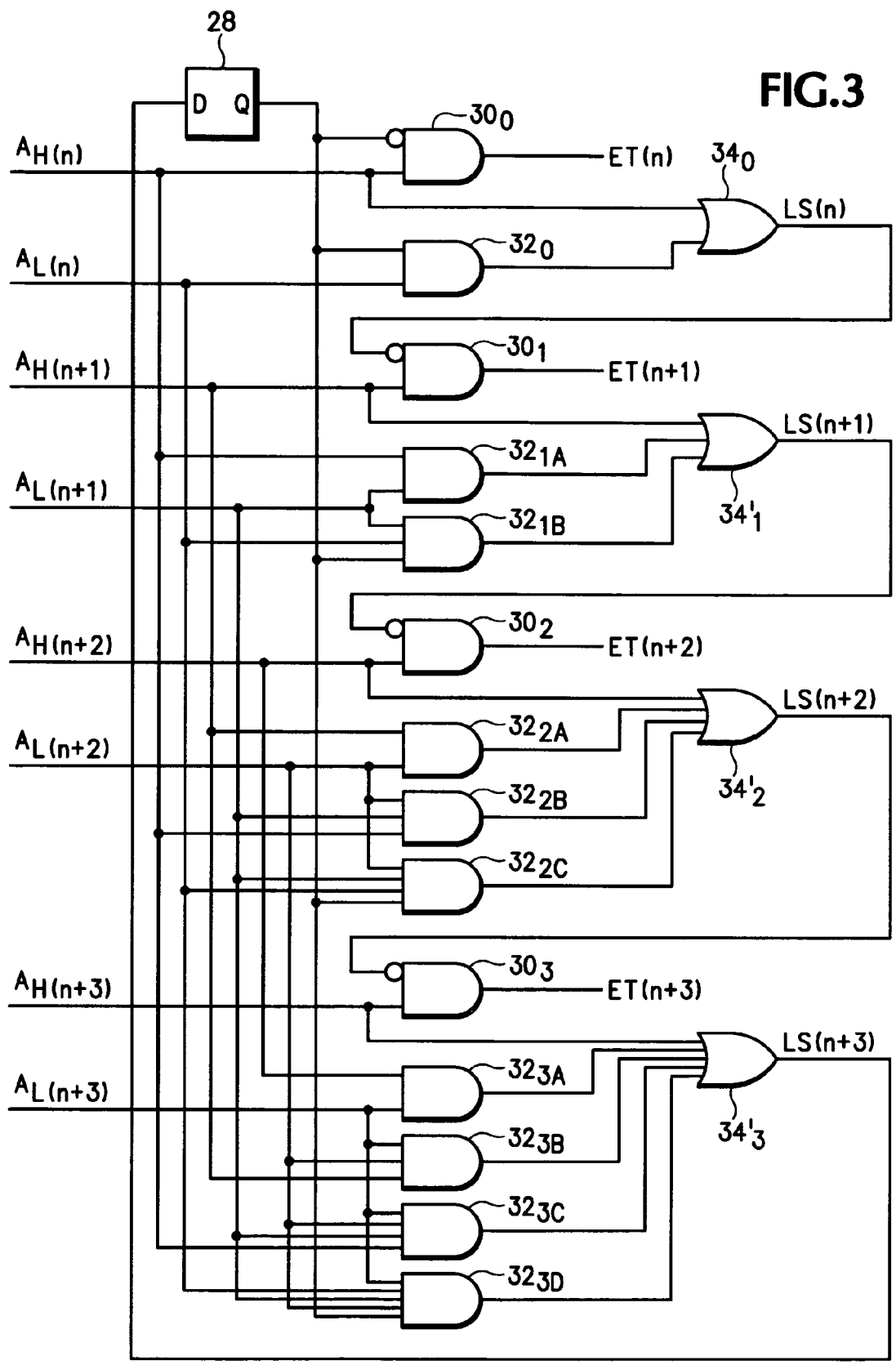
FIG. 3 is a block diagram view of an alternative edge trigger logic for the improved digital trigger according to the present invention.

The equation for LS3 is derived in the same manner. FIG. 3 shows the edge trigger logic using simple "look-ahead" logic to propagate the LS signal through four stages using just two gate delays.

The equation for LS2 may be broken into two parts—the "Generate" part (the first three terms) causes the output to go high without an input from an LS term and the "Propagate" part (the last term) contains an LS term, as shown by the following equations:

$$G(2,0) = AH2 | (AL2 \ \& \ AH1) | (A2 \ \& \ AL1 \ \& \ AH0)$$

$$P(2,0) = AL2 \ \& \ AL1 \ \& \ AL0$$

$$LS2 = G(2,0) | (P(2,0) \ \& \ LS(n-1))$$

In the example circuit of FIG. 3 there are four parallel paths from the ADC 12. For logic having twelve parallel paths the P and G equations are:

$$G(5,3) = AH5 | (AL5 \ \& \ AH4) | (AL5 \ \& \ AL4 \ \& \ AH3)$$

$$P(5,3) = AL5 \ \& \ AL4 \ \& \ AL3$$

$$LS5 = G(5,3) | (P(5,3) \ \& \ LS2)$$

$$G(8,6) = AH8 | (AL8 \ \& \ AH7) | (AL8 \ \& \ AL7 \ \& \ AH6)$$

$$P(8,6) = AL8 \ \& \ AL7 \ \& \ AL6$$

$$LS8 = G(8,6) | (P(8,6) \ \& \ LS5)$$

$$G(11,9) = AH11 | (AL11 \ \& \ AH10) | (AL11 \ \& \ AL10 \ \& \ AH9)$$

$$P(11,9) = AL11 \ \& \ AL10 \ \& \ AL9$$

$$LS11 = G(11,9) | (P(11,9) \ \& \ LS8)$$

These equations may be combined to allow quick computation of LS11:

$$LS11 = G(11,9) | (P(11,9) \ \& \ G(8,6)) | (P(11,9) \ \& \ P(8,6) \\ \& \ G(5,3)) | (P11,9) \ \& \ P(8,6) \ \& \ P(5,3) \ \& \ G(2,0)) | \\ (P(11,9) \ \& \ P(8,6) \ \& \ P(5,3) \ \& \ P(2,0) \ \& \ LS(n-1))$$

If after optimizing the propagation of the logic state signal the signal still doesn't propagate across all the parallel paths fast enough, then the number of parallel paths may be increased.

Having computed the logic state signal in one pipeline stage, the output of the comparators and the logic state are registered and become inputs to the next pipeline stage. The trigger is detected in this stage. When there are four parallel paths, there are four sets of logic—one for each path. The following equations show the logic used to detect a trigger for path (n) for a few different trigger modes:

Rising Edge: AH(n) & ~LS(n−1)

Falling Edge: ~AL(n) & LS(n−1)

Any Edge: (AH(n) & ~LS(n−1))|(~AL(n) & LS(n−1))

High Runt: AH(n) & ~AH(n−1) & LS(n−1)

Low Runt: ~AL(n) & AL(n−1) & ~LS(n−1)

Any Runt: (AH(n) & ~AH(n−1) & LS(n−1))|(~AL(n) & AL(n−1) & ~LS(n−1))

Logic that finds any specified Boolean function of AH(n), AH(n−1), AL(n), AL(n−1) and LS(n−1) may be used to implement all of these triggering modes as well as some additional triggering modes.

Although there are many trigger detection circuits working in parallel in the digital trigger logic 26, typically a trigger event is detected in just one circuit on any trigger system clock. However if trigger events occur at a high enough frequency, it is possible for a trigger event to be detected in multiple circuits. Therefore a priority encoder may be inserted after the detection of a trigger event so that only one trigger event is recognized during any trigger system clock cycle.

When a trigger event is recognized, a trigger position or trigger time relative to the data samples being acquired is desired. There are generally three parts to finding the trigger time. The first part is the trigger system clock on which the trigger event is detected. In many digital instruments a post-trigger counter is started when the trigger event is detected, and the counter may operate on the trigger system clock. A predetermined number of trigger system clocks after detecting the trigger event the counter stops the process of acquiring data. This allows the place in the acquired data where the trigger event was recognized to be found with the accuracy of one trigger system clock.

The second part of finding the trigger time is to note which of the parallel circuits detected the trigger event. With this information the trigger time within the acquired data may be determined to within one sample. The final part of finding the trigger time is to save a portion of the digitized trigger signal. The samples immediately before and immediately after the trigger event are saved in a memory. The number of samples to be saved depends on the accuracy desired and the amount of over-sampling. If the sample rate is much higher than the bandwidth of the digital acquisition circuit, the trigger time may be found by linear interpolation using the samples one before and one after the time the trigger signal passed the trigger threshold. Usually the sample rate is five to ten times higher than the instrument bandwidth. When the sample rate becomes as low as five times the bandwidth, many samples before and after the trigger point may be examined to find an accurate trigger time.

When the trigger data is being acquired in a different memory, the precise trigger point may be found by looking in the acquisition memory. There are times, however, when the trigger data may not be saved in the acquisition memory. For example the trigger data may come from an external trigger port, or the data being saved in the acquisition memory may have been transformed through peak detection, or it may be inconvenient to search the acquisition memory. In these cases the trigger data may be saved into a small memory that is used when it is desired to find a high-resolution trigger time.

There are multiple ways to find when the trigger data crossed the trigger threshold using the digitized trigger data. One way is to interpolate the sampled trigger signal using the same algorithm used to interpolate the corresponding signal waveforms. For instance if the trigger signal is interpolated by a factor of one hundred, the trigger time to within one percent of a sample interval may be found by finding the interpolated samples that bridge the trigger threshold. Another way to find the trigger time is to use standard interpolation techniques to increase the number of samples by a small factor, such as four. Then find the two samples that bridge the trigger threshold and use linear interpolation to find the time that the trigger signal crossed the trigger threshold. Still another way is to fit the data samples to an equation and solve the equation to find the time the trigger data passed through the trigger threshold. The methodology used is determined by the resolution and accuracy required, the speed within which the measurement is to be made, and the complexity of the circuit or software algorithm.

Figure 4:
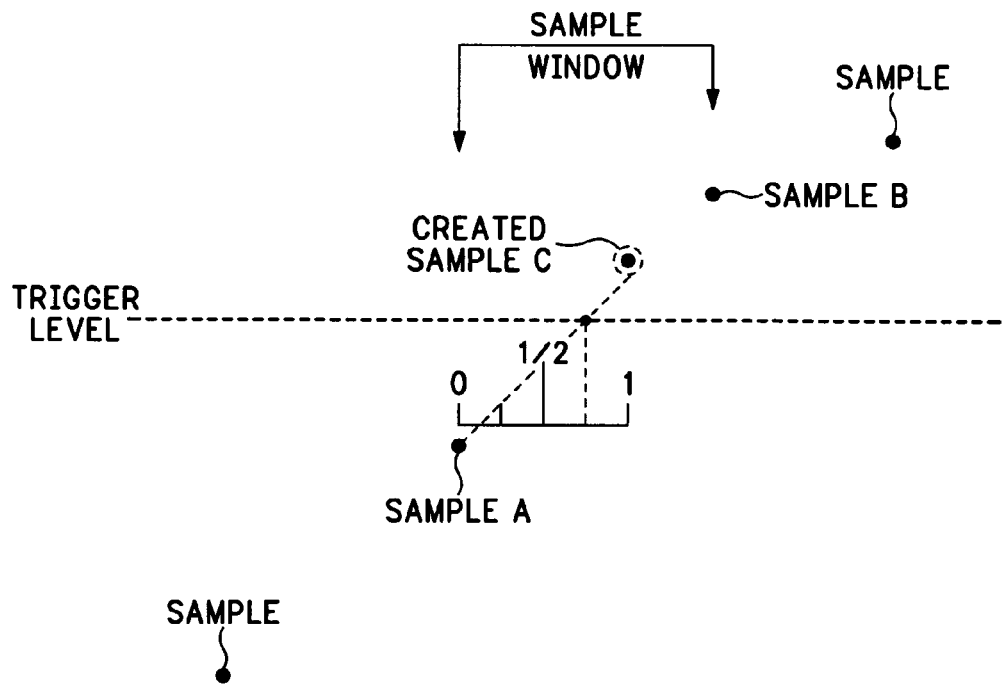
FIG. 4 is a graphic view illustrating a realtime interpolation technique for the improved digital trigger according to the present invention.

In each of the above methods the interpolation is performed on data that is stored away in memory. Therefore while the interpolation is being performed, the trigger circuit is stopped which results in dead time, i.e., time during which data acquisition stops and trigger events occurring during such time are not detected. In order to detect all trigger events the interpolation may be performed in real time with hardware. A realtime trigger interpolator may be performed in two stages—a filter to create sub-sample points followed by linear interpolation. As shown in FIG. 4 an input signal crossed a trigger level some time between sample A and sample B. Interpolation places the crossing with sub-sample accuracy. A first interpolation stage creates a sample point between sample A and sample B by using an appropriate filter. For example, if there are four samples—S0, S1, S2, S3—with the threshold crossing in the middle (between S1 (A) and S2 (B)), the interpolated sample point S1.5 (C) may be found by computing:

$$S1.5 = -1/16*S0 + 9/16*S1 + 9/16*S2 - 1/16*S3 \text{ or}$$

$$S1.5 = (-1*S0 + 9*S1 + 9*S2 - 1*S3)/16$$

Figure 5:
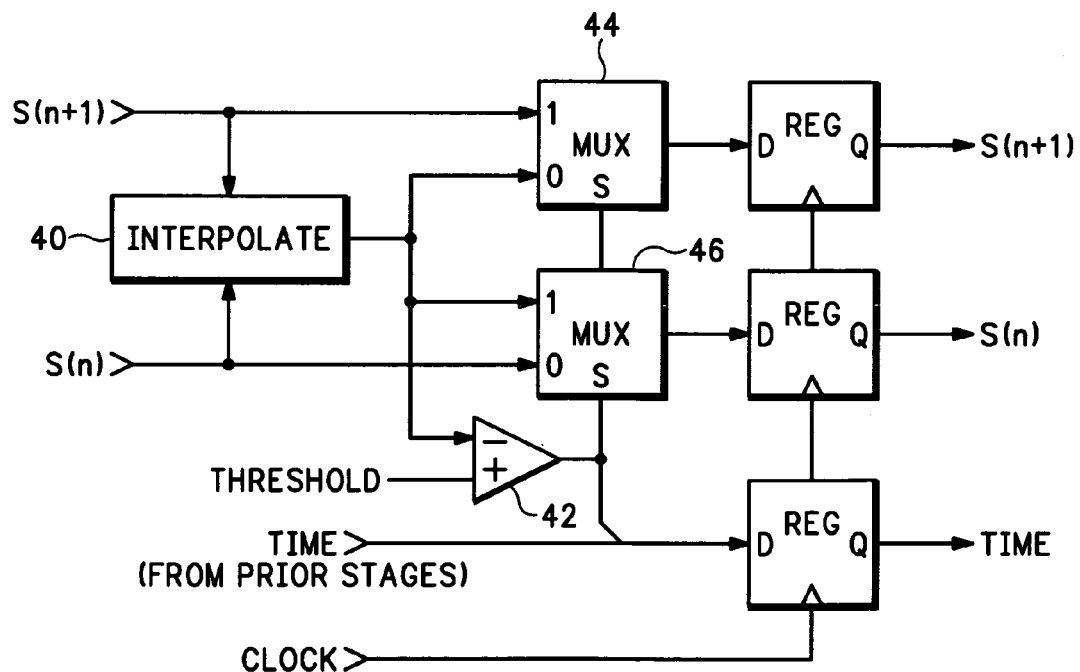
FIG. 5 is a block diagram view of a stage for a crossing detector for the improved digital trigger to determine trigger position with sub-sample accuracy according to the present invention.

For shorthand this is referred to as a (−1, 9, 9−1) filter knowing that everything is divided by 16 so that the gain at low frequencies is one. The created sample point is indicated by the intermediate point C. This point is tested against the trigger threshold to see if the crossing occurred in the first half of the sample window or the second half. Whether or not the interpolation is in the first half of the block or in the second half determines the most significant bit of the interpolation result. The second stage of the interpolation is a linear interpolation between the created sample C and the sample point, A or B, on the opposite side of the trigger level to generate the less significant interpolation result. This results in the time being found first to a resolution of one-half sample, then to one-quarter sample, etc. for additional stages, if desired. When there are multiple samples being processed in parallel per trigger system clock, which is likely when the sample rate of the system is very high, there are multiple instances of the sub-sample interpolator. FIG. 5 shows one stage of a realtime sub-sample interpolator or threshold crossing detector as described above.

The crossing detector has a number of identical pipelined stages, a block diagram of one of which is shown in FIG. 5.

Two samples S(n+1), S(n) that straddle the threshold are input to an interpolator 40 to find an estimate of the voltage at the center of the time interval between the samples. S(n) is below or equal to the threshold and S(n+1) is above the threshold. For multiple pipes these two samples are multiplexed from the pipes that have the threshold crossing to the input of the crossing detector. In addition to multiplexing S(n) and S(n+1), the pipe number for S(n) is sent to the "time" input of the crossing detector and becomes the most significant bits of the crossing time. The interpolated value is compared with the threshold in a comparator 42 to estimate whether the crossing occurred in the first or second half of the time interval. This becomes the least significant bit of the crossing or trigger time and is passed on as "time" to the next stage. Also the output from the comparator 42 is applied as a select signal to a pair of multiplexers 44, 46 to which are input respective ones of the sample inputs and the interpolated value so that the interpolated value replaces either S(n+1) or S(n), and the next stage receives two samples that straddle the threshold but have twice the effective sample rate as the samples that entered the stage.

The simplest interpolator 40 is a circuit that averages the two sample inputs to produce the result (S(n+1)+S(n))/2. The accuracy of the crossing detector may be improved by increasing the quality of the interpolator 40, with the greatest improvement occurring in the first stage, since after the first stage the effective sample rate is doubled and linear interpolation starts to be fairly accurate. To improve the first stage the following interpolation formula may be used:

result=(9*(S(n)+S(n+1))−(S(n−1)+S(n+2)))/16

This formula requires four input samples at the input to the first stage. The values of 9 and 16 are selected because they provide a good interpolation result and are easy to implement with addition and shifting. If the system clock rate is so high that the four-point interpolation may not be performed in one clock cycle, additional pipeline stages may be added to the first threshold crossing stage.

Triggering is sometimes qualified or allowed only when certain conditions are met. One example is the edge trigger that is only allowed when some signals in a logic probe are at a specified state. Another example is the edge trigger that is only allowed after a certain number of clocks on a different signal channel have occurred. The qualifying condition results in a logic signal that is true when triggering is allowed. The qualifying logic condition is sampled at the same time that the trigger signal is sampled. For instance if there are four ADCs 12 working in parallel to sample the trigger signal, then four flip-flops may be used to sample the qualifying condition, with each flip-flop being clocked at the same time as one of the ADCs. In this way a one-bit qualifying signal arrives at the trigger logic in parallel, synchronous with the digitized trigger signal. For a qualified rising edge trigger the qualifying signal, Q(n), is added to the conditions for detecting a trigger:

Qualified Rising Edge: AH(n) & ~LS(n−1) & Q(n)

The trigger time is found using the digitized trigger signal, just as it is for the simple edge trigger.

Increasing the amount of hysteresis while using the edge trigger implements noise rejection in the trigger signal. Increasing the difference between the upper and lower trigger levels increases the amount of hysteresis.

Figure 6A:
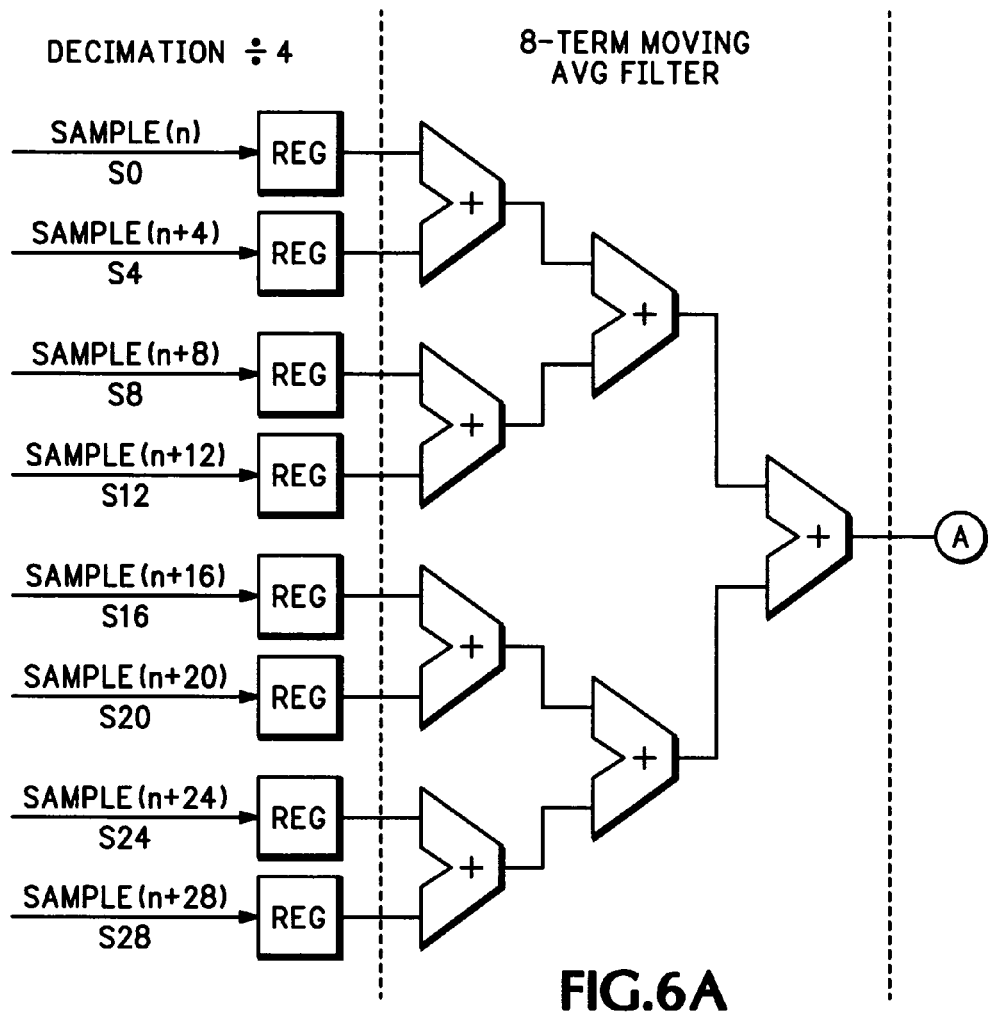
FIGS. 6a and 6b are a block diagram view of a digital lowpass filter for the improved digital trigger according to the present invention.
Figure 6B:
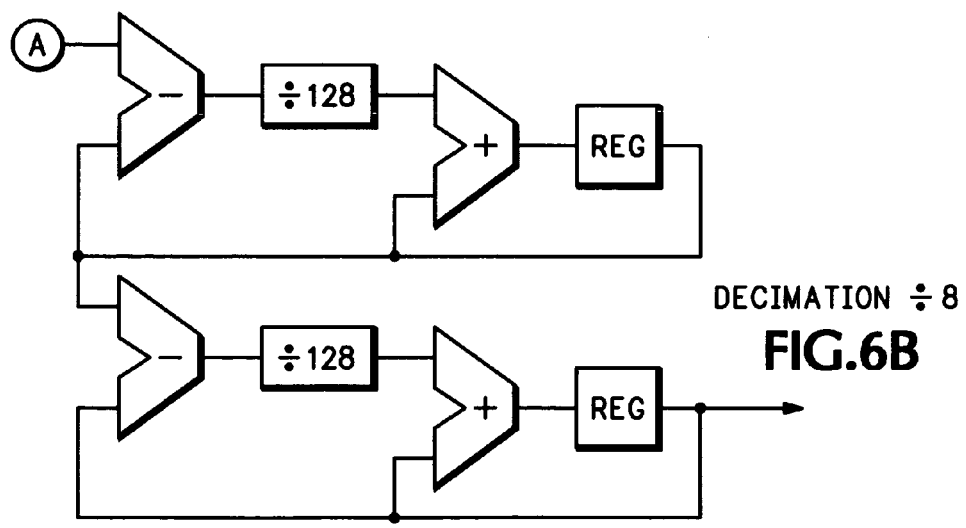

A digital circuit for a high frequency reject mode is shown in FIGS. 6A and 6B. In an analog trigger system the high frequency reject trigger uses an analog lowpass filter to remove high frequency components. The filter is often set to pass frequencies below 100 kHz. The digital high frequency reject trigger circuit is built by delivering the digitized trigger signal to a digital lowpass filter. The output of the filter is delivered to an edge trigger circuit similar to the edge trigger circuit described above, but is simpler because it accepts a single data stream. There are many ways to design a suitable lowpass filter. A moderately economical filter is described below. The filter is designed for a 200 MHz oscilloscope with a 2 GS/second sample rate. In this example thirty-two digitized trigger signal samples are delivered in parallel to the digital trigger every 16 ns trigger system clock.

The first step in designing the filter is to consider decimation. In this example the first stage in the filter is decimation by four. This causes signals near 500 MHz and 1 Ghz to alias into the frequency range near DC. This is acceptable because the bandwidth of a front end amplifier is 200 MHz so there are no significant signals near 500 MHz or 1 Ghz.

The next stage of the filter is an 8-term moving average filter followed by decimation by eight. Adding together eight adjacent samples creates this filter. If the original samples are designated S0, S1, . . . , S31, then this filter is made by finding the sum S0+S4+S8+S12+S16+S20+S24+S28. This sum is computed in the 16 ns of one trigger clock cycle. The decimation by eight is accomplished by clocking this sum into a register at the trigger system clock rate, every 16 ns.

The effect of this filter is to reduce some of the high frequency components. This filter has notches that reduce almost all of the frequency components near 62.5 MHz, 125 MHz, 187 MHz and 250 MHz. The decimation causes these same frequencies to be aliased to DC. So far the frequencies that are aliased into the frequency range of DC to 100 kHz either do not have a significant signal because of the front end filtering or are eliminated by the notches of the digital filter.

The decimation reduces the 32 parallel paths down to a single path clocked every 16 ns. The remaining filter stages are of a higher quality, but are fairly simple to build because the data rate is modest and there is just a single data path. These stages may be two identical filters placed in series. Each filter contains a register. On each trigger system clock the value in the register is increased by 1/128 of the input and decreased by 1/128 of the original value in the register. In many ways this is similar in performance to an analog filter made with a series resistor and a capacitor to ground. By having these two filters in series the bandwidth is about 100 kHz. Additional pipeline stages may be added if needed. Each stage of this filter increases the resolution, and the extra resolution may be used when finding the trigger position to less than a sample interval. This filter has a gain of one at DC when the proper output bits are used.

Figure 7:
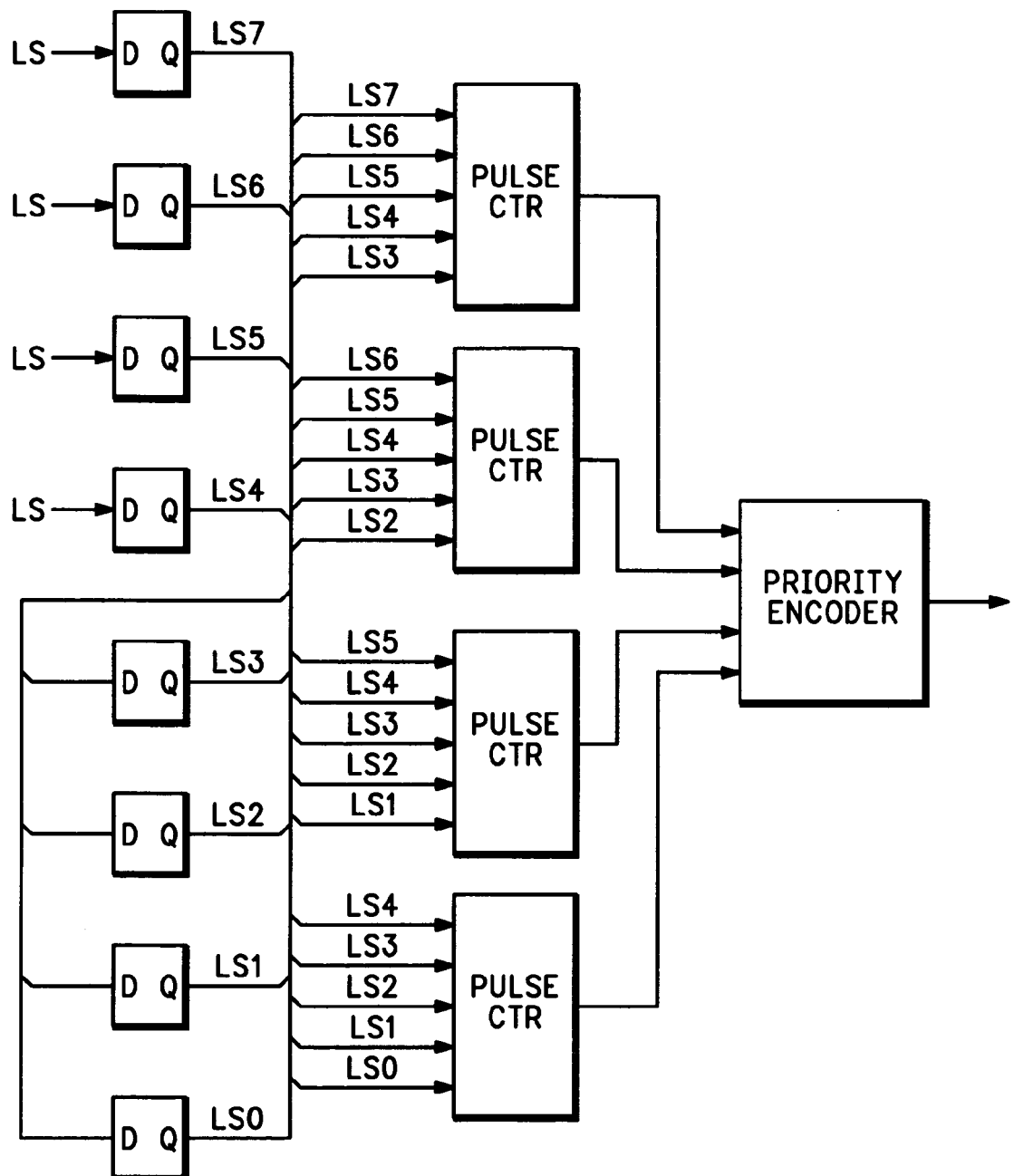
FIG. 7 is a block diagram view of a pulse width trigger logic for the improved digital trigger according to the present invention.

In a pulse width trigger mode a trigger is generated when the width of a pulse is less than a limit, greater than a limit, within limits or not within limits. The key to developing the pulse width trigger is to build a circuit that quickly measures the width of every pulse when many samples arrive in parallel. For example when triggering on a positive pulse, the time during which the Logic State signal is high is measured. The Logic State signals are developed in parallel in the edge trigger logic of FIGS. 2 and 3. If, for example, four samples of the trigger signal arrive in parallel, there are four Logic State signals generated in each trigger clock cycle. The pulse width trigger logic keeps a few previous Logic State signals and the current Logic State signals so that the last eight Logic State signals are available. When data arrives four samples at a time, there are four possible places for the pulse to start and four possible places for the pulse to stop. The width of the pulse is measured when the end of the pulse is found. Therefore to measure the width of all possible pulses, four identical circuits are used. Each circuit looks at four consecutive Logic State signals and measures the width of the pulse ending on the last of these signals. The pulse width is measured only when the pulse ends on this last sample. The four identical circuits are placed so that each examines a different group of four Logic State signals, as shown in FIG. 7.

Logic State signals from the edge trigger logic are clocked into the pulse width trigger circuit every trigger system clock. After being clocked into the circuit the oldest of these signals is LS0 and the newest is LS7. Signals LS0 through LS4 are delivered to the bottom pulse counter which measures the width of pulses ending at LS1. The other pulse counters from bottom to top measure the width of pulses ending on LS2, LS3 and LS4 respectively. All pulses in this configuration have to end at one of these points. Pipeline stages as needed are added to this circuit in order to allow the circuit to operate fast enough. The operation of the bottom pulse counter is illustrated by the following table:

| LS4 | LS3 | LS2 | LS1 | LS0 | ACTION |
|---|---|---|---|---|---|
|  |  |  |  | 0 | Set Pulse Width to 0 |
|  |  |  | 0 | 1 | Set Pulse Width to 1 |
|  |  | 0 | 1 | 1 | Set Pulse Width to 2 |
|  | 0 | 1 | 1 | 1 | Set Pulse Width to 3 |
| 0 | 1 | 1 | 1 |  | Add 4 to Pulse Width |
| 1 | 1 | 1 | 1 |  | Add 4 to Pulse Width |
|  |  |  | 1 | 0 | End of Pulse Found. Compare Width to Limits |
|  |  |  | 1 | 1 | Pulse Continues. Compare with Max Length |

Each pulse counter contains a pulse width register that is set to a specific value when a pattern matching the start of a pulse is found. This is shown by the first four entries of the Table. When the pattern found is a continuation of a pulse width (fifth entry in the Table), the pulse width register is incremented by four. The last two lines of the Table are the conditions that may lead to recognizing a trigger. When the end of the pulse is found, the pulse width register is compared to predetermined limits to see if a trigger should be generated. When the pulse continues, the current pulse width is compared to a maximum pulse length so that, if enables, a trigger is generated as soon as the pulse width becomes greater than a predetermined maximum length.

A general pulse width trigger has two predetermined pulse width limits so that a trigger may be generated when the end of the pulse is found and one of the following conditions is met:
the pulse width is less than limit one
the pulse width is greater than limit two
the pulse width is less than limit one or greater than limit two
the pulse width is greater than limit one and less than limit two In each of these cases the trigger is generated at the end of the pulse. The priority encoder shown in FIG. 7 resolves the case where more than one pulse counter detects a trigger in the same trigger system clock cycle. The priority encoder also produces a binary value indicating which pulse counter trigger is being recognized. The precise trigger position may be located as described above. The extra pipeline stages in the pulse width trigger need to be taken into account when saving the digitized trigger signal for determining trigger position. A pulse width trigger may also be generated when the end of the pulse has not been found, but the pulse width is greater than limit two. In this case the trigger position is found only to the nearest data sample. Negative pulse width triggering is accomplished by inverting the Logic State signals before they arrive at the pulse width trigger inputs.

A slow transition is detected when the trigger signal stays between the high and low trigger levels longer than a predetermined time. Slow transitions are detected by delivering a transition state to the pulse width trigger logic and then triggering when the condition exists longer than the predetermined time. The slow transition condition may be any of the following:

| LOGIC EQUATION | TRIGGER CONDITION |
|---|---|
| ~AU(n) & AL(n) | Slow rising and falling conditions |
| ~AU(n) & AL(n) & ~LS(n − 1) | Slow rising transition |
| ~AU(n) & AL(n) & LS(n − 1) | Slow falling transition |

Logic to compute these conditions and to multiplex these conditions into the input of the pulse width trigger is trivial. Although the primary use of this circuit is to trigger on slow transitions, the circuit may also trigger on fast conditions and transitions within time limits.

Thus the present invention provides an improved digital trigger that provides accurate trigger positioning by using the trigger sample signal prior to thresholding, that provides more accurate trigger event identification by using hysteresis, and that provides a high/low frequency rejection trigger.

What is claimed is:

1. An improved digital trigger circuit of the type having a plurality of data samples digitized by a sample clock from an input electrical signal for each system clock cycle wherein the improvement comprises:
   means for comparing each of the plurality of data samples with a low threshold value and a high threshold value to produce a plurality of above-high and a plurality of below-low threshold signals per system clock cycle; and
   means for logically processing in parallel the plurality of above-high and a plurality of below-low threshold signals to identify a selected trigger event.

2. The improved digital trigger circuit as recited in claim 1 further comprising means for positioning the selected trigger event from the plurality of data samples with sub-sample precision.

3. The improved digital trigger circuit as recited in claim 1 further comprising means for filtering the plurality of data samples to provide high frequency reject and low frequency reject trigger modes.

4. The improved digital trigger circuit as recited in claim 1 wherein the logically processing means comprises:
   an edge event trigger logic having as inputs the above-high and below-low threshold signals to produce a logic signal and a selected edge trigger event as the selected trigger event.

5. The improved digital trigger circuit as recited in claim 4 wherein the logically processing means further comprises a pulse width trigger logic having as inputs the logic state signal to produce a selected pulsewidth trigger event as the selected trigger event.

6. The improved digital trigger circuit as recited in claim 1 wherein the logically processing means comprises a time transition trigger logic having the above-high and below-low threshold signals as inputs to determine whether the time during which the plurality of digital samples stays between the high and low thresholds meets a specified criterion.

* * * * *